Figure 1:
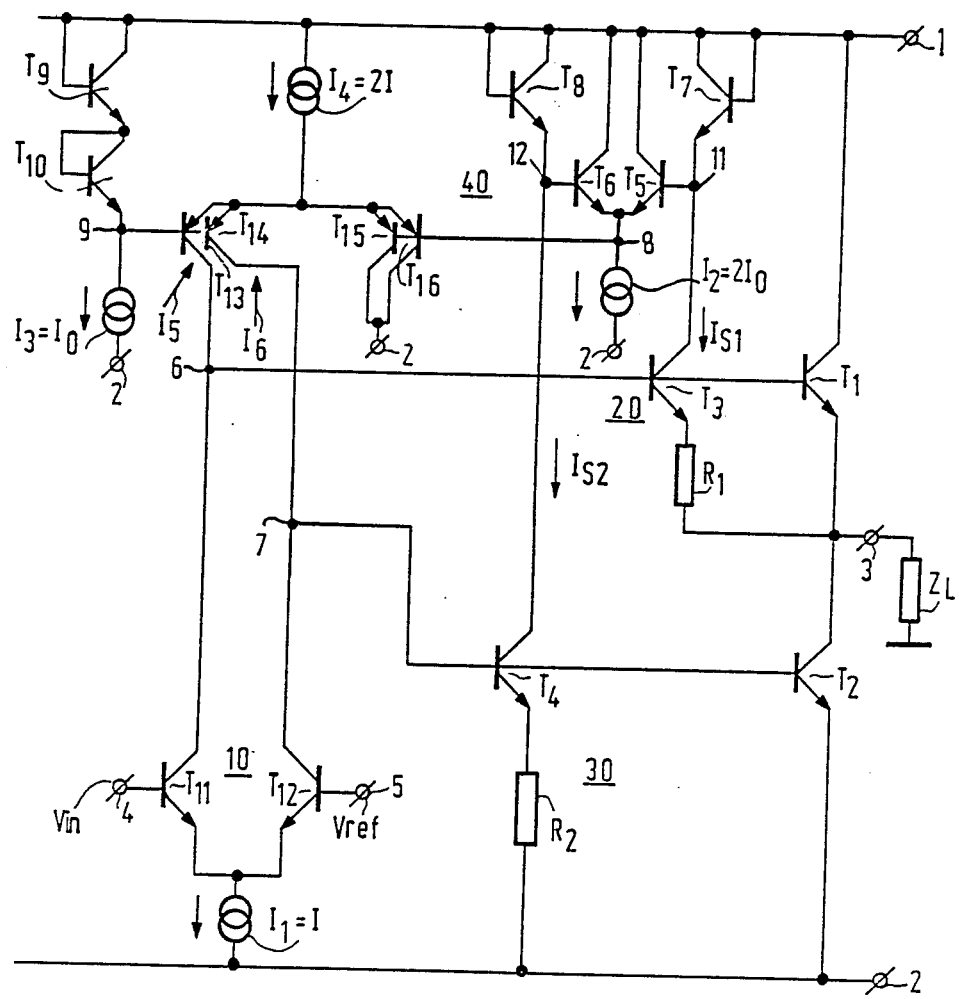

United States Patent [19]

Seevinck et al.

[11] Patent Number: 4,853,645
[45] Date of Patent: Aug. 1, 1989

[54] AMPLIFIER ARRANGEMENT WITH QUIESCENT CURRENT CONTROL

[75] Inventors: Evert Seevinck, Eindhoven; Willem De Jager, Enschede; Pieter Buitendijk, Nijmegen, all of Netherlands

[73] Assignee: U.S. Philips Corporation, New York, N.Y.

[21] Appl. No.: 249,623

[22] Filed: Sep. 26, 1988

Related U.S. Application Data

[63] Continuation-in-part of Ser. No. 162,921, Mar. 2, 1988.

[30] Foreign Application Priority Data

Sep. 23, 1987 [NL] Netherlands ............ 8702262

[51] Int. Cl.$^4$ ............................................. H03F 3/26
[52] U.S. Cl. ......................... 330/255; 330/253; 330/269; 330/273
[58] Field of Search ............... 330/252, 253, 255, 261, 330/262, 269, 273, 307

[56] References Cited

U.S. PATENT DOCUMENTS

| | | | |
|---|---|---|---|
| 4,555,676 | 11/1985 | van de Plassche et al. | 330/255 X |
| 4,661,781 | 4/1987 | Van Tuijl | 330/255 |
| 4,670,720 | 6/1987 | Dijkmans | 330/255 |
| 4,723,111 | 2/1988 | Verhoeven et al. | 330/255 |

Primary Examiner—Steven Mottola
Attorney, Agent, or Firm—Marianne R. Rich

[57] ABSTRACT

The first ($T_1$) and the second ($T_2$) output transistor of an amplifier arrangement are push-pull driven by means of a drive circuit (10) having two transistors ($T_{11}$, $T_{12}$) which are each loaded by a current source ($T_{13}$, $T_{14}$). Currents which are a measure of the currents flowing through the first ($T_1$) and the second ($T_2$) output transistor are generated by first (20) and second (30) current measuring means. These currents are applied to a negative feedback means (40) which controls the current intensity of the current sources ($T_{13}$, $T_{14}$) in such a way that the harmonic mean value of the currents flowing through the first ($T_1$) and the second ($T_2$) output transistor is substantially equal to a reference value.

20 Claims, 7 Drawing Sheets

AMPLIFIER ARRANGEMENT WITH QUIESCENT CURRENT CONTROL

This is a continuation-in-part of application Ser. No. 162,921, filed Mar. 2, 1988.

The invention relates to an amplifier arrangement comprising a first and a second output transistor each having a first main terminal, a second main terminal and a control terminal, whose main current paths are arranged in series between two power supply terminals and are further coupled to an output for connecting a load, drive means for driving the first and the second transistor, said drive means having a first input for applying an input signal, a second input, a first output which is coupled to the control terminal of the first transistor and a second output which is coupled to the control terminal of the second transistor, quiescent current means for causing a quiescent current to flow through the first and the second output transistor, said quiescent current means having first and second current measuring means for generating a first and a second measuring current which are a measure of the current flowing through the first and the second output transistor, respectively, and having feedback means for controlling the quiescent current flowing through the first and the second output transistor by way of the first and the second measuring current.

In the description and the appendant claims the first main terminal, the second main terminal and the control terminal are identical to the drain, the source and the gate, respectively, in the case of unipolar transistors, and to the collector, the emitter and the base, respectively, in the case of bipolar transistors.

An amplifier arrangement of this type can be generally used as a power amplifier arrangement and is particularly suitable as an output amplifier in audio circuits.

Such an amplifier arrangement is known from European patent application EP-A-No. 0,217,431.

The first and the second output transistor are push-pull driven by the non-inverting and the inverting output, respectively, of a voltage-to-current converter which has a non-inverting input to which the input voltage is applied and an inverting input which is connected to the output of the amplifier arrangement.

The amplifier arrangement is of the class AB type because a given quiescent current flows through the two output transistors. The means for adjusting the value of this quiescent current comprise a measuring circuit for each of the two output transistors for measuring the current through the relevant output transistor. This measuring current is converted across a first diode into a voltage which is applied to the inverting input of an amplifier. A reference voltage generated across a second diode is applied to the non-inverting input thereof. In the absence of an input signal to drive the output transistors, the output of the amplifier controls the relevant output transistor in such a way that the voltage at the inverting input of this amplifier will become equal to the reference voltage. When driving one of the two output transistors, the current through the driven transistor increases and the quiescent current through the non-driven transistor decreases. The known arrangement is, however, adapted in such a way that the non-driven transistor is fully turned off. If the relevant transistor is subsequently driven, it should first be turned on, which causes cross-over distortion.

It is therefore an object of the invention to provide an amplifier arrangement having an improved quiescent current control. According to the invention, an amplifier arrangement of a type described in the opening paragraph is characterized in that the feedback means comprise a first differential amplifier having a third and a fourth transistor each having a control terminal, a first main terminal and a second main terminal, the second main terminals being coupled to a common point which is coupled to a first current source, the control terminal of the third transistor being coupled to a first point for conveying a voltage which is proportional to the first measuring current and the control terminal of the fourth transistor being coupled to a second point for conveying a voltage which is proportional to the second measuring current, a reference circuit comprising a second current source and a fifth transistor having a first main terminal, a second main terminal and a control terminal which is coupled to the first main terminal, and a second differential amplifier having a sixth and a seventh transistor each having at least one first main terminal, at least one second main terminal and a control terminal, the control terminal of the sixth transistor being coupled to the second main terminal of the fifth transistor, the control terminal of the seventh transistor being coupled to the common point of the first differential amplifier, and two of the first main terminals of the sixth and the seventh transistor being coupled to the first and the second output of the drive means.

The structure of the negative feedback means according to the invention causes the quiescent current through the non-driven output transistor to be controlled to a substantially constant value, which keeps this transistor conducting independent of the extent to which the other output transistor is driven. This prevents the one output transistor from being turned off when the other output transistor is fully turned on. Consequently, the cross-over distortion caused thereby is considerably reduced.

The further structure of the negative feedback means is determined by the conductivity type of the first and the second output transistor. If the first and the second output transistor are of the same conductivity type, an embodiment of the amplifier arrangement may be further characterized in that the sixth and the seventh transistor each have two first main terminals, and in that the one first main terminal of the sixth transistor is coupled to the first output of the drive means and the other first main terminal of the sixth transistor is coupled to the second output of the drive means.

A further embodiment of such an amplifier arrangement may be characterized in that the first current measuring means include an eighth transistor having a first main terminal, a second main terminal and a control terminal, the control terminal and the second main terminal being coupled to the control terminal and the second main terminal, respectively, of the first output transistor and in that the second current measuring means include a ninth transistor having a first main terminal, a second main terminal and a control terminal, the control terminal and the second main terminal being coupled to the control terminal and the second main terminal, respectively, of the second output transistor. This embodiment may be further characterized in that the second main terminal of the eighth transistor is coupled to the second main terminal of the first output transistor by means of a first resistor and in that the second main terminal of the ninth transistor is coupled to the second main terminal of the second output transistor by means of a second resistor. The first and the second resistor limit the maximum current through the eight and the ninth transistor, which prevents these transistors from damage when the output transistors are fully turned on.

Another embodiment of such an amplifier arrangement may be characterized in that
the first main terminal of the eighth transistor is coupled to a first power supply terminal by means of a tenth transistor having a first main terminal, a second main terminal and a control terminal, the first main terminal of the tenth transistor being coupled to its control terminal and the second main terminal constituting the first point for conveying a voltage which is proportional to the first measuring current,
the first main terminal of the ninth transistor is coupled to the first power supply terminal by means of an eleventh transistor having a first main terminal, a second main terminal and a control terminal, the first main terminal of the eleventh transistor being coupled to its control terminal and the second main terminal constituting the second point for conveying a voltage which is proportional to the second measuring current, and in that
the first main terminal of the fifth transistor is coupled to the first power supply terminal by means of a twelfth transistor having a first main terminal and a second main terminal and a control terminal, the first main terminal being coupled to its control terminal. The currents generated by the first and second current measuring means across the tenth and the eleventh transistor are converted into voltages which are proportional thereto and which are applied to the control terminals of the third and the fourth transistor.

Yet a further embodiment of such an amplifier arrangement may be characterized in that the drive means include a third differential amplifier having a thirteenth and a fourteenth transistor each having a first main terminal, a second main terminal and a control terminal, the control terminal and the first main terminal of the thirteenth transistor being coupled to the first input and the first output, respectively, of the drive means and the control terminal and the second main terminal of the fourteenth transistor being coupled to the second input and the second output, respectively, of the drive means. This embodiment may be further characterized in that a first capacitor is arranged between the first input and the first output of the drive means and in that the first input of the drive means is coupled to an input of a fifteenth transistor arranged as a voltage follower, an output of which is coupled to the second output of the drive means by means of a second capacitor. The first capacitor ensures a frequency compensation for obtaining a stable gain and the second capacitor ensures a direct signal transmission to the control terminal of the second output transistor in the case of high frequencies. This results in the phase shift being reduced, thus improving the stability of the amplifier arrangement.

Yet another embodiment of such an amplifier arrangement may be characterized in that the first output of the drive means is coupled to a non-inverting input of an amplifier, an inverting input of which is coupled to the output of the amplifier arrangement and an output of which is coupled to the control terminal of the first output transistor. This amplifier constitutes a negative feedback from the output of the control terminal of the first output transistor so that the non-linearities caused by this transistor are reduced. This negative feedback is effective at all drive conditions because it is ensured that the first output transistor remains conducting in the amplifier arrangement according to the invention.

In another embodiment this amplifier may be characterized in that it is constituted by a fourth differential amplifier having a sixteenth and a seventeenth transistor each having a control terminal and a first and a second main terminal, the control terminal of the sixteenth transistor being coupled to the non-inverting input and the control terminal of the seventeenth transistor being coupled to the inverting input, the first main terminal of the seventeenth transistor being coupled to the output of the amplifier and to a current source.

Yet another embodiment may be characterized in that the first output of the drive means is coupled to an input of a voltage follower circuit, an output of which is coupled to the control terminal of the first output transistor by means of a third capacitor. At high frequencies the third capacitor ensures a direct signal transmission from the drive means to the control terminal of the first output transistor and thereby eliminates the phase shift occurring in the amplifier at high frequencies. This improves the stability of the amplifier arrangement.

The amplifier arrangment according to the invention may be suitably formed with bipolar transistors. In that case the negative feedback means control the current through the first and the second output transistor in such a way that the harmonic mean value of these currents is maintained substantially constant. The amplifier arrangement may, however, also be formed with field-effect transistors. The negative feedback means then control the currents through the first and the second output transistor in such a way that a relationship which complies with the equation for a circle is present between these currents.

In an amplifier arrangement according to the invention, the first and the second output transistor may be alternatively of the opposite conductivity type instead of the same conductivity type. The amplifier arrangement may then be further characterized in that
the sixth and the seventh transistor each have a first main terminal and in that
the first main terminal of the sixth transistor is coupled to the first output of the drive means and the first main terminal of the seventh transistor is coupled to the second output of the drive means.

This embodiment is very suitable for low power supply voltages. A further embodiment of such an amplifier arrangement may be characterized in that
the first current measuring means include an eighth transistor having a first main terminal, a second main terminal and a control terminal, the control terminal being coupled to the control terminal of the first output transistor and the second main terminal being coupled to the second main terminal of the first output transistor by means of a first resistor, said second main terminal of the eighth transistor constituting the first point for conveying a voltage which is proportional to the first measuring current, the second current measuring means include a ninth transistor having a first main terminal, a second main terminal and a control terminal, the control terminal being coupled to the control terminal of the second output transistor and the second main terminal being coupled to the second main terminal of the second output transistor by means of a second resistor, the first main terminal of the ninth transistor is coupled to a first power supply terminal by means of a third resistor, said first main terminal of the ninth transistor constituting the second point for conveying a voltage which is proportional to the second measuring current, and in that the first main terminal of the fifth transistor is coupled to the first power supply terminal by means of a fourth resistor.

The first measuring current flows through the first resistor and the voltage across this resistor is directly applied to the control terminal of the third transistor. The second measuring current is converted across the third resistor into a voltage which is proportional thereto and which is applied to the control terminal of the fourth transistor.

Yet another embodiment of such an amplifier arrangement may be characterized in that the drive means include a third differential amplifier with a tenth transistor having a first main terminal, a second main terminal and a control terminal and an eleventh transistor having two first main terminals, two second main terminals and a control terminal, the control terminal of the tenth transistor being coupled to the first input of the drive means and the control terminal and the two first main terminals being coupled to the second input and the first and the second output, respectively, of the drive means. This embodiment may be further characterized in that a first capacitor is arranged between the first input and the first main terminal of the tenth transistor and in that a second capacitor is arranged between the control terminal of the first output transistor and the output, and in that a third capacitor is arranged between the control terminal of the second output transistor and the output. These capacitors enhance the stability of the amplifier arrangement.

This amplifier arrangement may be suitably formed with bipolar transistors. The negative feedback means then control the currents through the first and the second output transistor in such a way that the harmonic mean value of these currents is maintained substantially constant. This amplifier arrangement can of course also be formed with field-effect transistors instead of bipolar transistors.

Figure 2A:
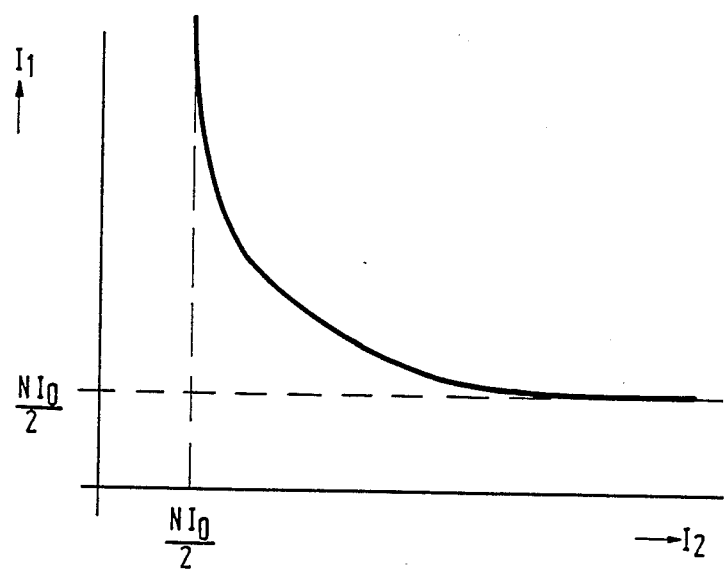
Figure 2B:
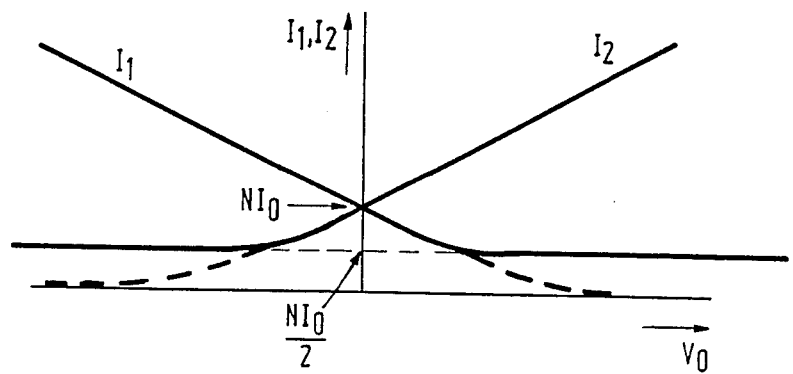
Figure 3:
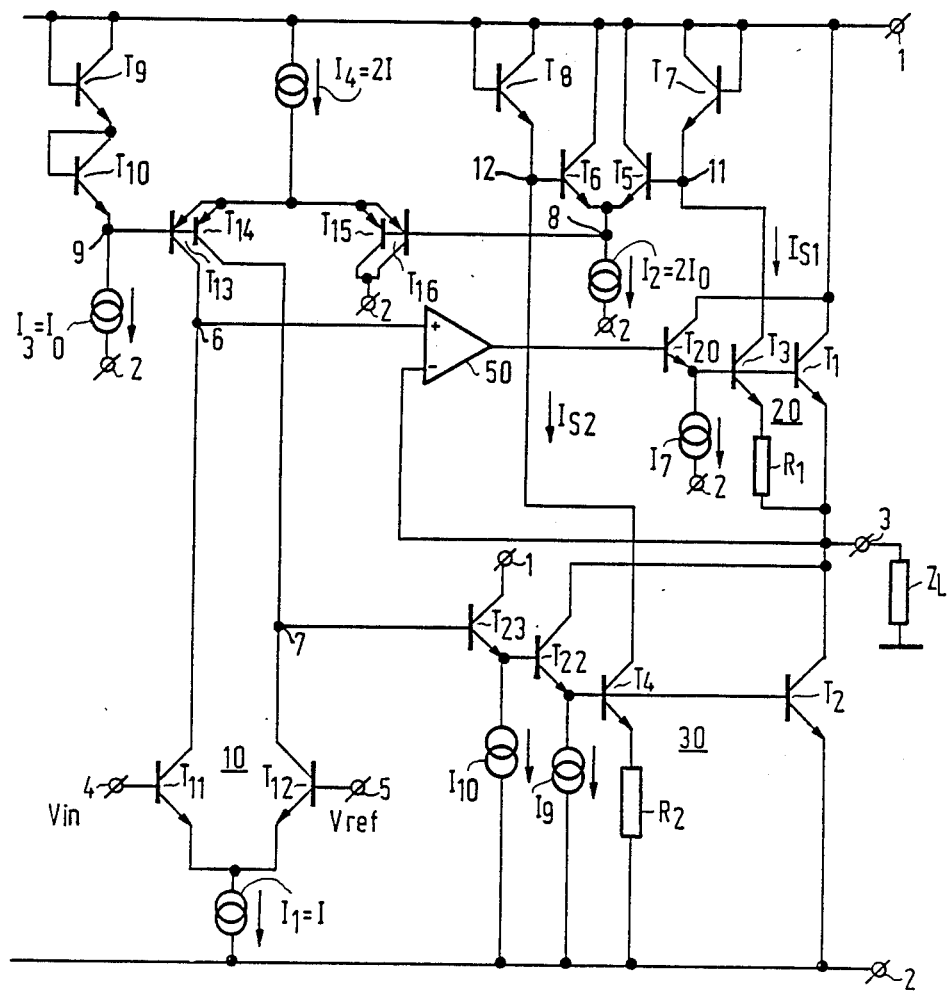
Figure 4:
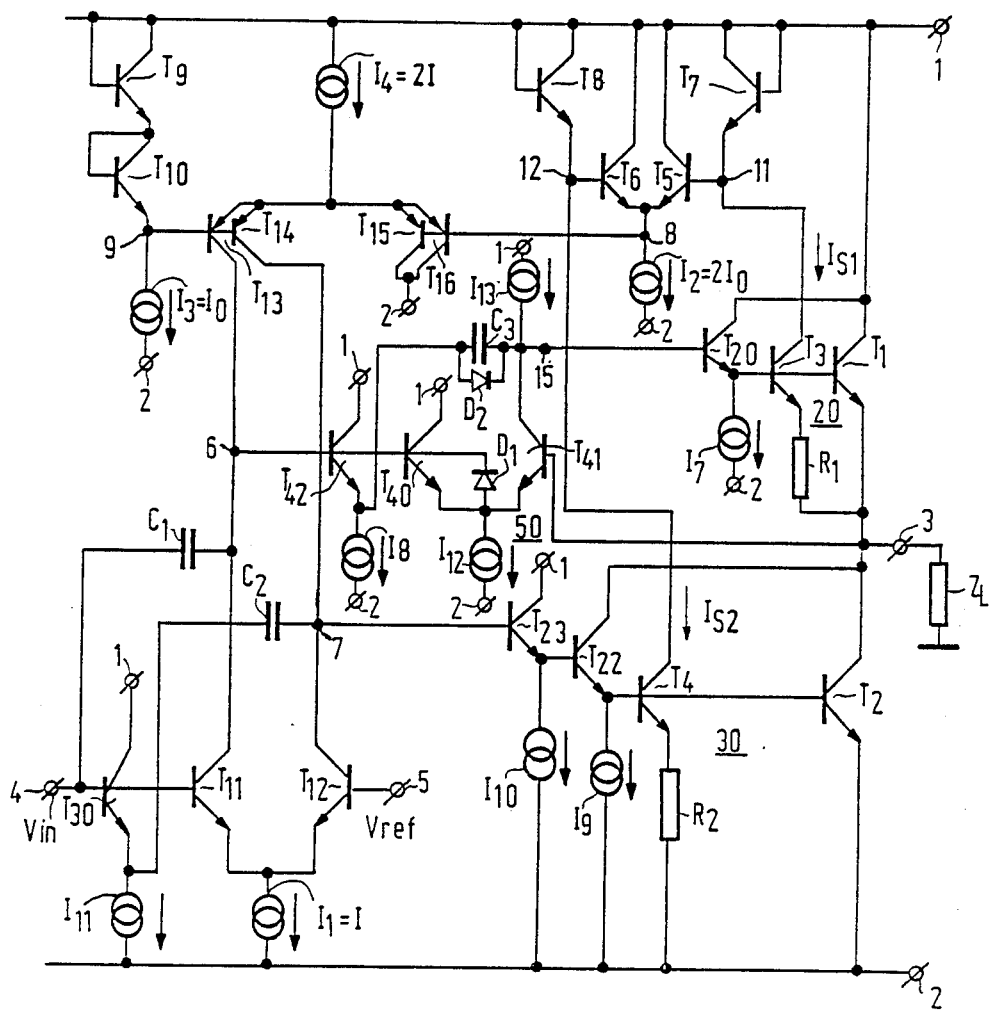
Figure 5:
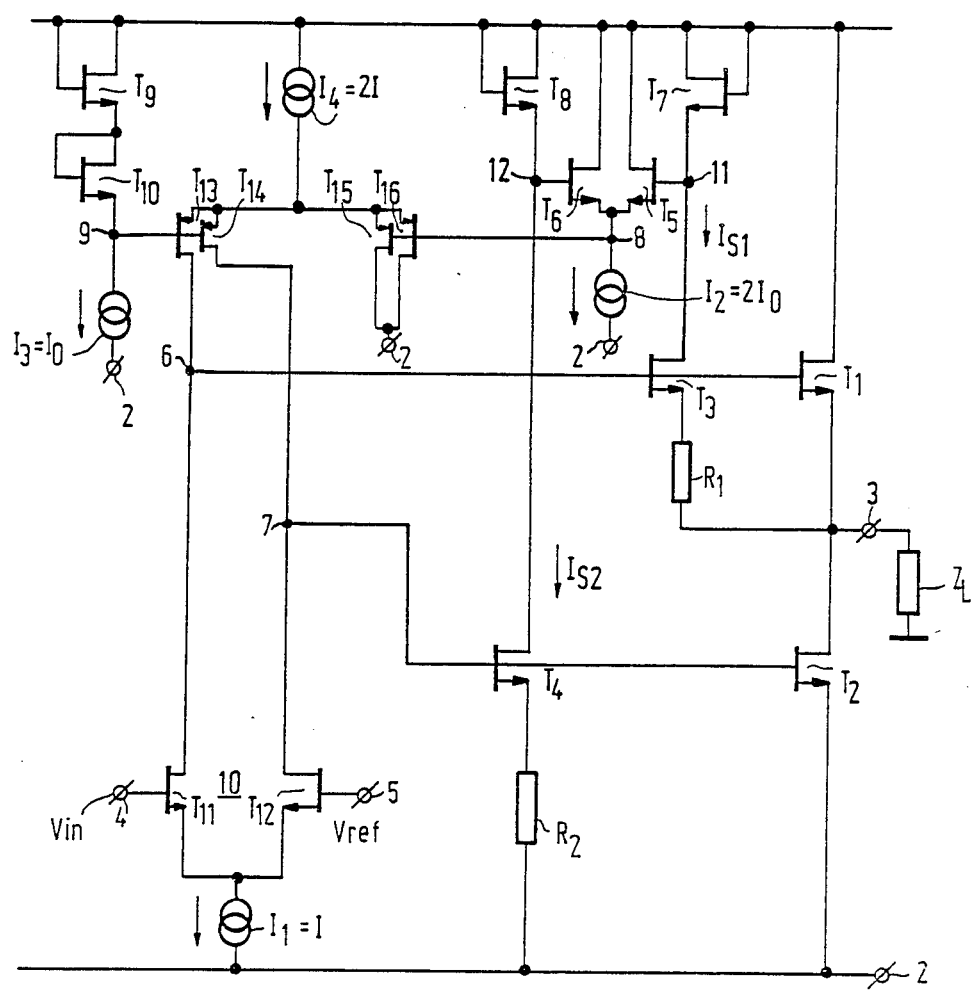
Figure 6A:
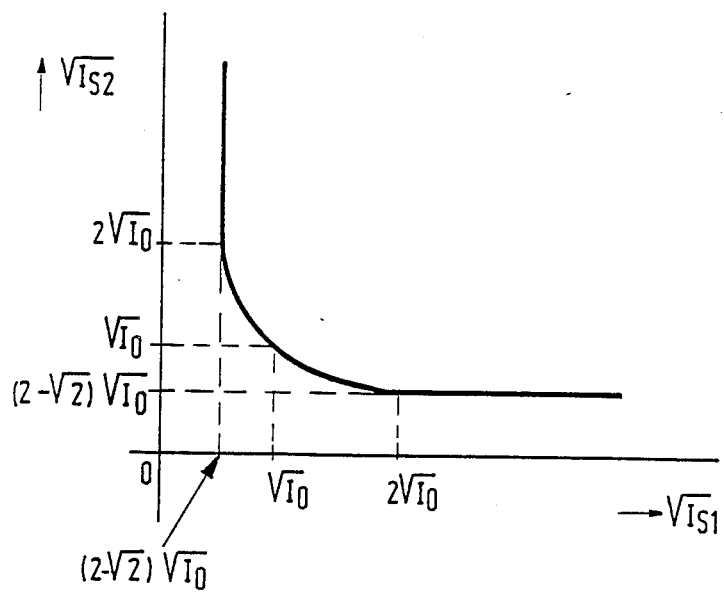
Figure 6B:
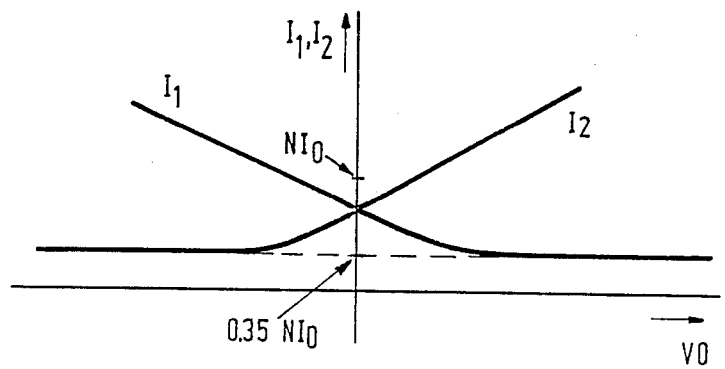
Figure 7:
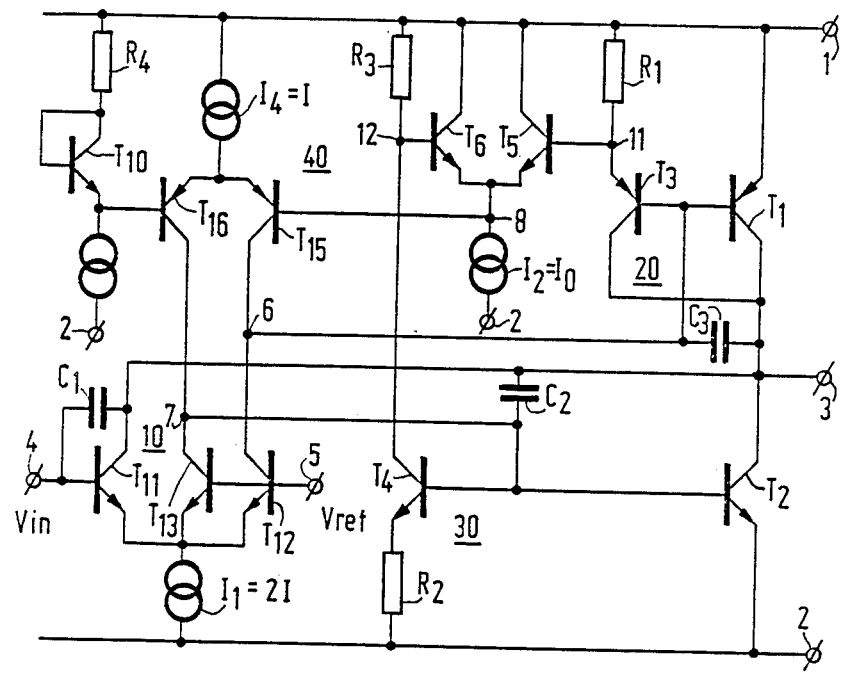
Figure 8:
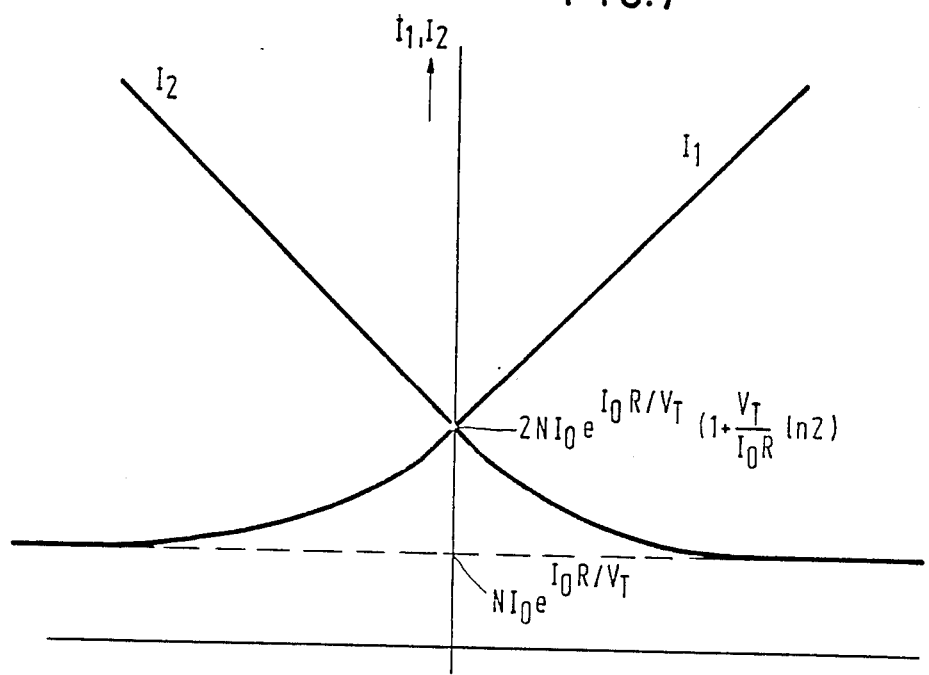

The invention will now be described in greater detail, by way of example, with reference to the accompanying drawings in which FIG. 1 shows a first embodiment of an amplifier arrangement according to the invention, FIG. 2a shows the relationship between the currents through the output transistors, FIG. 2b shows the waveforms of the currents through the output transistors as a function of the output voltage of the amplifier, FIG. 3 shows a second embodiment of an amplifier arrangement according to the invention, FIG. 4 shows a third embodiment of an amplifier arrangement according to the invention, FIG. 5 shows a fourth embodiment of an amplifier arrangement according to the invention, FIG. 6a shows the relationship between the measuring currents in the circuit arrangement of FIG. 5, FIG. 6b shows the waveforms of the quiescent currents as a function of the output voltage for the amplifier arrangement of FIG. 5, FIG. 7 shows a fifth embodiment of an amplifier arrangement according to the invention, and FIG. 8 shows the waveforms of the currents through the output transistors as a function of the output voltage for the amplifier arrangement of FIG. 7.

FIG. 1 shows a first embodiment of an amplifier arrangement according to the invention. The arrangement comprises a first output transistor $T_1$ and a second output transistor $T_2$ whose collector-emitter paths are arranged in series between a first power supply terminal 1 and a second power supply terminal 2. The emitter of transistor $T_1$ and the collector of transistor $T_2$ are connected to an output 3 of the amplifier arrangement to which a load $Z_l$ is connected.

The amplifier arrangement also comprises drive means 10 for push-pull driving of the first and the second output transistor $T_1$, $T_2$. The drive means 10 comprise a differential amplifier having two transistors $T_{11}$ and $T_{12}$ whose emitters are connected to a common point which is connected to the power supply terminal 2 by means of a current source $I_1=I$. The base of transistor $T_{11}$ is connected to a first input 4 to which an input voltage $V_{in}$ is applied. This signal originates from an input stage which may have a conventional structure such as that of a $\mu A741$-input stage. The base of transistor $T_{12}$ is connected to a second input 5 conveying a reference voltage $V_{ref}$. The collector of transistor $T_{11}$ is connected to a first output 6 which is coupled to the base of transistor $T_1$ and to the collector of transistor $T_{13}$ constituting a variable current source $I_5$. Similarly, the collector of transistor $T_{12}$ is connected to a second output 7 which is coupled to the base of transistor $T_2$ and is connected to the collector of a transistor $T_{14}$ constituting a variable current source $I_6$.

The current sources $I_5$ and $I_6$ form part of quiescent current means for causing a quiescent current to flow through the output transistors $T_1$ and $T_2$ in order to obtain a class AB adjustment of the amplifier arrangement. These quiescent current means have first current measuring means 20 which are constituted by a transistor $T_3$ whose base-emitter junction is arranged in series with a first resistor $R_1$ parallel to the base-emitter junction of transistor $T_1$. The collector current of transistor $T_3$ is a measure of the collector current of transistor $T_1$ and is determined by the ratio of the emitter surfaces of the transistors $T_1$ and $T_3$ and the resistance of the resistor $R_1$. In order to minimize the dissipation of the arrangement, the emitter surface of transistor $T_3$ is preferably chosen to be much smaller than that of transistor $T_1$. The resistor $R_1$ limits the maximum current through transistor $T_3$ to a safe value so as to prevent this transistor from being damaged when transistor $T_1$ is fully turned on. It is to be noted that the resistor $R_1$ may in principle be dispensed with. The quiescent current means also have second current measuring means 30 which are similarly provided with a transistor $T_4$ whose base-emitter junction in series with a resistor $R_2$ is arranged parallel to the base-emitter junction of transistor $T_2$. The collector current of transistor $T_4$ is a measure of the current flowing through transistor $T_2$. The quiescent current means also comprise negative feedback means 40 which keep the harmonic mean value of the measuring currents supplied by the first and second measuring means 20 and 30 and hence the currents through the first and the second output transistor $T_1$ and $T_2$ substantially equal to a reference value. The negative feedback means 40 comprise a first differential amplifier having two transistors $T_5$ and $T_6$ whose emitters are connected to a common point 8 which is connected to the second power supply terminal 2 by means of a current source $I_2=2I_0$. The base 11 of transistor $T_5$ is connected to the first power supply terminal via a transistor $T_7$ arranged as a diode and to the collector of transistor $T_3$. Similarly, the base 12 of transistor $T_6$ is connected to the first power supply terminal 1 via a transistor $T_8$ arranged as a diode and to the collector of transistor $T_4$. The negative feedback means 40 also comprise a reference circuit which is constituted by a current source $I_3=I_0$ whose output 9 is connected to the first power supply terminal 1 via two series-arranged transistors $T_9$ and $T_{10}$ arranged as diodes. The negative feedback means 40 also comprise a second differential amplifier having two transistors $T_{13}$ and $T_{14}$ whose base-emitter junctions are arranged in parallel and two transistors $T_{15}$ and $T_{16}$ whose base-emitter junctions are also arranged in parallel. The emitters of the transistors $T_{13}$–$T_{16}$ are connected to a common point which is connected to the positive power supply terminal 1 by means of a current source $I_4=2I$. The common base of the transistors $T_{15}$ and $T_{16}$ is connected to the point 8 of the differential amplifier $T_5$, $T_6$. The collectors of the transistors $T_{15}$ and $T_{16}$ are connected to the second power supply terminal 2. The common base of the transistors $T_{13}$ and $T_{14}$ is connected to the output 9 of current source $I_3$. The collector of transistor $T_{13}$ is connected to the first output 6 and the collector of transistor $T_{14}$ is connected to the second output 7 of the drive means 10. Transistor $T_{13}$ constitutes a variable current source $I_5$ and transistor $T_{14}$ constitutes a variable current source $I_6$.

It is to be noted that the transistors $T_{13}$ and $T_{14}$ as well as the transistors $T_{15}$ and $T_{16}$ may be replaced by one single transistor having a double collector.

The operation of the arrangement may be explained as follows. The class AB adjustment affects the bases of the output transistors $T_1$ and $T_2$ as a common mode signal, whilst the signal to be amplified affects the bases of these transistors as a difference mode signal. In the means 40 a first translinear loop can be distinguished which is constituted by the transistors $T_5$–$T_8$. The following relation holds for this loop:

$$V_{BET7} + V_{BET5} = V_{BET8} + V_{BET6} \quad (1)$$

in which $V_{BE}$ is the base-emitter voltage of the relevant transistor. By means of the known exponential relation between the base-emitter voltage and the collector current of a transistor and the assumption that the transistors $T_5$–$T_8$ have identical emitter surfaces, this equation results in:

$$I_{S1} \cdot I_0(1+a) = I_{S2} \cdot I_0(1-a) \quad (2)$$

in which
$I_{S1}$ = the first measuring current flowing through transistor $T_7$ and being supplied by the first measuring means 20, $I_2$ = the second measuring current flowing through transistor $T_8$ and being supplied by the second measuring means 30 and $aI_0$ = the signal current through the transistors $T_5$ and $T_6$ determined by a difference in the first and the second measuring current $I_{S1}$ and $I_{S2}$.

It follows from this equation that $$\frac{I_{S2}}{I_{S1}} = \frac{1+a}{1-a} \text{ ofwel } a = \frac{I_{S2} - I_{S1}}{I_{S2} + I_{S1}} \quad (3)$$

In the means 40 a second translinear loop may also be distinguished which is constituted by the transistors $T_8$, $T_6$, $T_{16}$, $T_{13}$, $T_{10}$ and $T_9$. The following equation holds for this loop:

$$V_{BET8} + V_{BET6} + V_{BET13} = V_{BET9} + V_{BET10} + V_{BET16} \quad (4)$$

By means of the known exponential transistor equation and again assuming that the transistors have identical emitter surfaces, this equation results in $$I_{S2} \cdot I_0(1-a) \cdot I \frac{(1+Z)}{2} = I_0^2 \cdot I \frac{(1-Z)}{2} \quad (5)$$

in which $Z_1$ = the signal current through the transistors $T_{13}$ and $T_{16}$ determined by a voltage difference between the bases 8 and 9. It follows that $$I_0 \cdot \frac{1-Z}{1+Z} = I_{S2}(1-a) \quad (6)$$

Filling in equation 3, this results in $$I_0 \cdot \frac{1-Z}{1+Z} = \frac{2I_{S1} \cdot I_{S2}}{I_{S1} + I_{S2}} \quad (7)$$

10 or $$Z = \frac{I_0(I_{S1} + I_{S2}) - 2I_{S1} \cdot I_{S2}}{I_0 \cdot (I_{S1} + I_{S2}) + 2I_{S1} \cdot I_{S2}} \quad (8)$$

The collector current of transistor $T_{13}$ is equal to $I_5 = I(1+Z/2)$. Since transistor $T_{14}$ is arranged in parallel with transistor $T_{13}$, the collector current of transistor $T_{14}$ is also equal to $I_6 = I(1+Z/2)$.

In the absence of an input voltage $V_{in}$ at the input 4 of the drive means 10 the current I of current source $I_1$ will be evenly distributed over the transistors $T_{11}$ and $T_{12}$ so that a direct current I/2 flows through each of these transistors. These direct currents are compensated by the direct currents I/2 which flow through the transistors $T_{13}$ and $T_{14}$. Consequently, a current ZI/2 flows via output 6 to the base of transistor $T_1$ and an equally large current ZI/2 flows via output 7 to the base of transistor $T_2$. A quiescent current resulting in a first and an equal second measuring current $I_{S1}$ and $I_{S2}$ will therefore flow through transistors $T_1$ and $T_2$. The transistors $T_1$ and $T_2$ are now driven in such a way that the voltage at the point 8 determined by these measuring currents is equal to the reference voltage at the point 9. For the value of the quiescent current flowing through transistors $T_1$ and $T_2$ the following applies. The current gain factors of the transistors $T_1$ and $T_2$ are very large. This means that the base currents ZI/2 are very small and may be assumed to be approximately zero. With $I_{S1} = I_{S2}$ it follows from equation 7 or 8 for the measuring currents flowing in the absence of an input voltage $V_1$ that:

$$I_{S1} = I_{S2} = I_0 \tag{9}$$

For relatively small currents the voltage across the resistors $R_1$ and $R_2$ is small with respect to the base-emitter voltages of the transistors $T_3$ and $T_4$. For a ratio of base-emitter surfaces of the transistors $T_1$, $T_3$ and $T_2$, $T_4$ which is equal to N it holds for the value of the quiescent currents flowing through the transistors $T_1$ and $T_2$ that:

$$I_1 = I_2 = N\, I_0 \tag{10}$$

In the case of an input voltage $V_{in}$ at the input 4 which is, for example, smaller than the reference voltage $V_{ref}$ at the input 5, the current through transistor $T_{12}$ increases and the current through transistor $T_{11}$ decreases. Consequently, the base current of transistor $T_1$ increases and that of transistor $T_2$ decreases so that transistor $T_1$ is further turned on and transistor $T_2$ is further turned off. As a result, the measuring current $I_{S1}$ through transistor $T_3$ increases and the measuring current $I_{S2}$ through transistor $T_4$ decreases. Consequently, the voltage across the base-emitter junction of transistor $T_7$ increases and the voltage across the base-emitter junction of transistor $T_8$ decreases. At already relatively small currents transistor $T_5$ will therefore be turned off so that transistor $T_6$ will start behaving as an emitter follower. The voltage at the common point 8 thus increases so that transistors $T_{15}$ and $T_{16}$ will convey less current and transistors $T_{13}$ and $T_{14}$ will convey more current. The base current of both transistor $T_1$ and of transistor $T_2$ consequently increases. In this way the measuring current $I_{S2}$ and consequently the quiescent current through transistor $T_2$ is controlled to a well-defined residual value independent of the extent to which transistor $T_1$ is turned on. When driving transistor $T_2$, the quiescent current through transistor $T_1$ is similarly controlled to the same residual value.

When ignoring the base currents of the transistors $T_1$ and $T_2$ it follows from equation 7 that the currents $I_1$ and $I_2$ are determined by the following equation:

$$\frac{2 I_1 \cdot I_2}{I_1 + I_2} = N \cdot I_0 \tag{11}$$

It is apparent from the equation above that the circuit 40 controls the harmonic mean value of the currents through the transistors $T_1$ and $T_2$ to a value which is equal to a reference value. In FIG. 2a the relationship between the currents $I_1$ and $I_2$ determined by means of equation 11 is shown graphically. FIG. 2b shows the waveforms of the currents $I_1$ and $I_2$ through the transistors $T_1$ and $T_2$ as a function of the voltage $V_{out}$ at the output 3 of the amplifier arrangement. For the sake of comparison the waveforms of these currents in the known circuit arrangement are shown in broken lines in this Figure. As is apparent from this Figure, the residual current of the non-driven output transistor is each time controlled to a constant value. It follows from equation 11 that this residual current is given by:

$$I_r = (N\, I_0)/2 \tag{12}$$

In this embodiment the residual current is thus equal to half the quiescent current in the absence of an input signal. Due to this residual current the non-driven transistor is each time partly turned on and is prevented from being turned off. Consequently, the cross-over distortion is reduced. Since the base-emitter voltage variations of the output transistors are small, the distortion caused thereby is also small. Since the first output transistor $T_1$ is always turned on, the variation of the output impedance of this transistor and hence of the total amplifier arrangement is small so that the distortion of the output signal caused thereby is also small. Moreover, the dissipation in the non-driven output transistor is substantially constant because the residual current flowing therethrough is accurately fixed and is substantially constant. It is to be noted that the harmonic mean value of the currents through the output transistors and hence the residual current can be controlled to a different value in the case of a different choice of the ratio of the emitter surfaces and/or bias currents. Furthermore, the factor ½ in equation (12) can be modified by giving the transistors in the described translinear loops different emitter surfaces.

FIG. 3 shows a second embodiment of an amplifier arrangement according to the invention in which the same components have the same reference numerals as in FIG. 1. The output transistor $T_1$ is arranged in a Darlington configuration with a transistor $T_{20}$, whilst the collector is connected to the collector of transistor $T_1$ and the emitter is connected to the base of transistor $T_1$ and to the second power supply terminal 2 by means of a current source $I_7$. The base of transistor $T_{20}$ is connected to the first output 6 of the drive means 10. Similarly, transistor $T_2$ is arranged in a Darlington configuration with a transistor $T_{22}$, whilst the emitter of transistor $T_{22}$ is connected to the second power supply terminal 2 by means of a current source $I_9$. The base of transistor $T_{22}$ is driven by a voltage follower with a transistor $T_{23}$ and a current source $I_{10}$. The base of transistor $T_{23}$ is connected to the second output 7 of the drive means 10.

The Darlington configurations $T_1$, $T_{20}$ and $T_2$, $T_{22}$ ensure a very large current gain and consequently very small base currents in the transistors $T_{20}$ and $T_{23}$.

In the embodiment of FIG. 3 the first output 6 of the drive means is connected to the non-inverting input of an amplifier 50 whose inverting output is connected to the output 3 of the amplifier arrangement. The output of the amplifier 50 is connected to the base of transistor $T_{20}$. The amplifier 50 ensures a negative feedback around the Darlington configuration $T_1$, $T_{20}$. This results in the distortion of the output voltage due to non-linearities of the output transistor $T_1$ being eliminated, so that the voltage $V_0$ at the output 3 accurately follows the voltage at the output 6 of the drive means 10. Since transistor $T_1$ is always turned on as a result of the quiescent current control according to the invention, it is ensured that this negative feedback continues to function correctly under all circumstances.

FIG. 4 shows a third embodiment of an amplifier arrangement according to the invention in which the same components have the same reference numerals as in FIG. 3. A frequency compensation capacitor $C_1$ which, as is known, stabilizes the gain if the amplifier arrangement is driven by a conventional input amplifier, is arranged between the input 4 of the amplifier arrangement and the first output 6 of the drive means 10. The input 4 is also connected to the base of a transistor $T_{30}$ whose collector is connected to the power supply terminal 1 and whose emitter is connected to the power supply terminal 2 by means of a current source $I_{11}$ and to the second output 7 of the drive means 10 by means of a capacitor $C_2$. The capacitor $C_2$ ensures that the input voltage $V_{in}$ is directly applied to the base of transistor $T_{23}$ via voltage-follower transistor $T_{30}$ in the case of high frequencies. This enhances the phase margin and hence the stability of the amplifier arrangement. The capacitors $C_1$ and $C_2$ also stabilize the control loop which controls the quiescent current because they provide a dominant-pole in this loop.

In this embodiment the amplifier 50 is constituted by a differential amplifier having two transistors $T_{40}$, $T_{41}$ whose emitters are connected to a common point which is connected to the power supply terminal 2 via a current source $I_{12}$. The base of transistor $T_{40}$ is connected to the first output 7 of the drive means 10 and the base of transistor $T_{41}$ is connected to the output 3 of the amplifier arrangement. The collector of transistor $T_{40}$ is directly connected to the power supply terminal 1 and the collector of transistor $T_{41}$ is connected to the positive power supply terminal 1 by means of a current source $I_{13}$ and to an output 15 of the amplifier 30. This output 15 is connected to the base of transistor $T_{20}$. The first output 6 of the drive means 10 is also connected to the base of a transistor $T_{42}$ whose collector is connected to the first power supply terminal 1 and whose emitter is connected to the second power supply terminal 2 by means of a current source $I_8$ and to the output 15 of amplifier 30 by means of a capacitor $C_3$. In the region where amplifier 50 exhibits a large phase shift, capacitor $C_3$ ensures that the signal at the first output 6 is directly applied to the base of transistor $T_{20}$. A first diode $D_1$ is arranged between the base and the emitter of transistor $T_{40}$ and a second diode $D_2$ is arranged parallel to capacitor $C_3$. These diodes prevent the amplifier $T_{40}$, $T_{41}$ from being overdriven in the case of fast, step-wise signals (transients).

FIG. 5 shows a fourth embodiment of an amplifier arrangement according to the invention in which the same components have the same reference numerals as in FIG. 1. The arrangement now comprises MOS field-effect transistors instead of bipolar transistors.

In the negative feedback means 40 two translinear loops can be distinguished again. For the first loop with transistors $T_5$–$T_{10}$ the following equation holds:

$$V_{GST7} + V_{GST5} = V_{GST6} + V_{GST8} \tag{13}$$

in which $V_{GS}$ is the gate-source voltage of the relevant transistor. For the second loop with transistors $T_8$, $T_6$, $T_{16}$, $T_{13}$, $T_{10}$ and $T_9$ the following equation holds:

$$V_{GST8} + V_{GST6} + V_{GST13} = V_{GST9} + V_{GST10} + V_{GST16} \tag{14}$$

Due to the strong negative feedback in the negative feedback loop it can be assumed that the second differential amplifier $T_{13}$–$T_{16}$ is always balanced, so that it holds that:

$$V_{GST13} = V_{GST14} = V_{GST15} = V_{GST16} \tag{14A}$$

For the second translinear loop it thus holds that:

$$V_{GST9} + V_{GST10} = V_{GST6} + V_{GST8} \tag{15}$$

For identical transistors and using the quadratic relationship between the drain source current $I_D$ and the gate source voltage $V_{GS}$ of a MOS transistor:

$$I_D = 1/2\beta(V_{GS} - V_T)^2 \tag{16}$$

in which
$\beta$ = a geometry factor and
$V_T$ = the threshold voltage of the transistor,
equations (13) and (15) can be written as follows $$2\sqrt{I_0} = \sqrt{I_{S1}} + \sqrt{I_0(1+a)} = \sqrt{I_{S2}} + \sqrt{I_0(1+a)} \tag{17}$$

in which
$I_0(1+a)$ = the current through transistor $T_5$ and
$I_0(1-a)$ = the current through transistor $T_6$.
Equation (17) can be rewritten as $$I_0(1+a) = (2\sqrt{I_0} - \sqrt{I_{S1}})^2 \tag{18}$$

$$I_0(1-a) = (2\sqrt{I_0} - \sqrt{I_{S2}})^2 \tag{19}$$

By addition of these equations and rewriting, it holds for the relationship between the measuring currents $I_{S1}$ and $I_{S2}$ that:

$$(\sqrt{I_{S1}} - 2\sqrt{I_0})^2 + (\sqrt{I_{S2}} - 2\sqrt{I_0})^2 = 2I_0 \tag{20}$$

This equation describes a locus of a circle a quarter of which is valid. FIG. 6a shows this relationship between the measuring currents $I_{S1}$ and $I_{S2}$.

With $I_{S1} = I_{S2}$ it follows from equation 20 for the measuring currents flowing in the absence of an input voltage that:

$$I_{S1} = I_{S2} = I_0 \tag{21}$$

For relatively small currents the voltage across resistors $R_1$ and $R_2$ is small with respect to the gate-source voltage of the transistors $T_3$ and $T_4$. In the case of a ratio of the length-width ratio of the transistors $T_1$ and $T_3$ and of the transistors $T_2$ and $T_4$ equal to N it holds for the quiescent currents flowing through transistors $T_1$ and $T_2$ that $$I_1 = I_2 = N I_0 \tag{22}$$

It follows from equation (20) that when driving, for example, transistor $T_1$ the quiescent current through transistor $T_2$ is controlled to a residual value which is given by $$I_r = N I_{S2rest} = N(2-\sqrt{2})^2 I_0 \approx 0.35 N I_0 \tag{23}$$

When driving transistor $T_1$, the quiescent current through transistor $T_2$ is controlled in the same manner to the same residual value. The waveforms of the quiescent currents through the output transistors as a function of the output voltage of the amplifier is shown diagrammatically in FIG. 6b. The residual current in this embodiment is thus approximately equal to 0.35 times the quiescent current in the absence of an input signal. In the same way as in the bipolar embodiment, this prevents the non-driven output transistor from being turned off and thereby causing distortion.

FIG. 7 shows a fifth embodiment of an amplifier arrangement according to the invention. Unlike the previous embodiments, the arrangement comprises output transistors of the opposite conductivity type instead of the same type. The arrangement comprises a PNP output transistor $T_1$ and an NPN output transistor $T_2$ whose collector-emitter paths are arranged in series between a first power supply terminal 1 and a second power supply terminal 2. The collectors of transistor $T_1$ and of transistor $T_2$ are connected to the output 3 of the amplifier arrangement.

The transistors $T_1$ and $T_2$ are driven in phase by drive means 10. These means are provided with a differential amplifier having a transistor $T_{11}$ and two transistors $T_{12}$ and $T_{13}$ whose base-emitter junctions are arranged in parallel and whose emitters are connected to a common point which is connected to power supply terminal 2 by means of a current source $I_1=I$. The base of transistor $T_1$ is connected to the input 5 to which an input voltage is applied which may originate from an input stage of the conventional type. The common base of the transistors $T_{12}$ and $T_{13}$ is connected to a second input 5 which conveys a reference voltage $V_{ref}$. The collector of transistor $T_{12}$ is connected to a first output 6 of the drive means to which the base of transistor $T_1$ is connected and the collector of transistor $T_{13}$ is connected to a second output 7 to which the base of transistor $T_2$ is connected.

The amplifier arrangement is provided with quiescent current means for controlling the quiescent currents through the transistors $T_1$ and $T_2$. These means comprise first current measuring means 20 which are constituted by a PNP transistor $T_3$ whose base-emitter junction in series with a resistor $R_1=R$ is arranged parallel to the base-emitter junction of transistor $T_1$. The current through transistor $T_3$ and resistor $R_1$ is a measure of the current through transistor $T_1$. To minimize the dissipation, the emitter surface of transistor $T_3$ is chosen to be much smaller than that of transistor $T_1$. The resistor $R_1$ also limits the maximum value of the current through transistor $T_3$ to prevent damage when transistor $T_1$ is fully turned on. The quiescent current means further comprise second current measuring means having a transistor $T_4$ whose base-emitter junction in series with a resistor $R_2=R$ is arranged parallel to the base-emitter junction of transistor $T_2$. The collector current of transistor $T_4$ is a measure of the current flowing through transistor $T_2$. This current is converrted across a resistor $R_3=R$ into a voltage which is proportional thereto.

The quiescent current means also comprise negative feedback means 40 which are provided with a first differential amplifier having two transistors $T_5$ and $T_6$ whose emitters are connected to a common point 8 which is connected to the second power supply terminal 2 by means of a current source $I_2=I_0$. The base 11 of transistor $T_5$ is connected to the emitter of transistor $T_3$ and the base 12 of transistor $T_6$ is connected to the collector of transistor $T_4$. The negative feedback means also comprise a reference circuit which is constituted by the series arrangement of a transistor $T_{10}$ arranged as a diode and a resistor $R_4=R$ to which a current source $I_3=I_0$ is connected. The negative feedback means 40 also comprise a second differential amplifier having two transistors $T_{15}$ and $T_{16}$ whose emitters are connected to a common point which is connected to the positive power supply terminal 2 by means of a current source $I_4=2I$. The base of transistor $T_{15}$ is connected to the common point 8 of the differential amplifier $T_5$, $T_6$ and the base of transistor $T_{16}$ is connected to the emitter of transistor $T_{10}$.

The operation of the arrangement may be explained as follows. Two loops can be distinguished in the means 40. For the loop with resistors $R_1$, $R_4$ and transistors $T_5$, $T_{10}$, $T_{15}$ and $T_{16}$ and for the loop with resistors $R_3$, $R_4$, $T_6$, $T_{10}$, $T_{15}$ and $T_{16}$ the following equations hold, assuming that the differential amplifier $T_{15}$, $T_{16}$ will be balanced due to the negative feedback:

$$I_{S1}.R + V_{BET5} = I_0.R + V_{BET10} \quad (24)$$

$$I_{S2}.R + V_{BET6} = I_0.R + V_{BET10} \quad (25)$$

in which
$I_{S1}$ = the current through resistor $R_1$
and $I_{S2}$ = the current through resistor $R_3$.

The relationship between the currents $I_1$ and $I_2$ through transistors $T_1$ and $T_2$ and the measuring currents $I_{S1}$ and $I_{S2}$ is given by $$I_1 = N I_{S1}.e^{RI_{S1}/V_T} \quad (26)$$

and $$I_2 = N I_{S2}.e^{RI_{S2}/V_T} \quad (27)$$

With the known relationship between the base-emitter voltage and the collector current of a transistor the following can be written for the equations 24 and 25

$$I_{S1}.R + V_T \ln (I_{T6}/I_{SP}) = I_0 R + V_T \ln (I/I_{SP}) \quad (28)$$

$$I_{S2}.R + V_T \ln (I_{T5}/I_{SP}) = I_0 R + V_T \ln (I/I_{SP}) \quad (29)$$

With these equations the following relations can be obtained by means of solution for the currents through transistors $T_5$ and $T_6$ $$I_{T5} = [I_0.e^{I_0R/V_T}].e^{-I_{S2}.R/V_T} \quad (30)$$

$$I_{T6} = [I_0.e^{I_0R/V_T}].e^{-I_{S1}.R/V_T} \quad (31)$$

Furthermore it holds that $$I_{T5} + I_{T6} = I_0 \quad (32)$$

If equation (32) is combined with equations (30) and (31) the equation indicating the relationship between the measuring currents $I_{S1}$ and $I_{S2}$ is obtained:

$$e^{-I_{S1}.R/V_T} + e^{-I_{S2}.R/V_T} = e^{I_0.R/V_t} \quad (32)$$

By filling in the equations (26) and (27) in this equation, the relationship between the output currents $I_1$ and $I_2$ is obtained. However, this equation does not give a simple analytic relationship. The waveform of the output currents as a function of the output voltage $V_0$ of the amplifier arrangement is shown in FIG. 8.

In the absence of an input voltage the quiescent currents of transistors $T_1$ and $T_2$ will be equally large, so that it also holds that $I_{S1} = I_{S2}$. It follows from equation (32) that:

$$I_{S1} = I_{S2} = I_0 + V_T/R. \ln 2 \quad (33)$$

With the aid of equation (26) or (27) it follows for the value of the quiescent current of transistors $T_1$ and $T_2$ that:

$$I_1 = I_2 = 2NI_0e^{I_0R/V_T}\{1 + V_T/I_0R\}.\ln 2\} \quad (34)$$

For calculating the residual current of an output transistor when the other output transistor is driven, the measuring current of the driven output transistor, for example, $I_{S2}$ is assumed to be very large in equation (32). It follows for the measuring current that $$I_{S1} = I \tag{35}$$

With the equation (26) it follows for the residual current through output transistor $T_1$ that $$I_r = NI_0 e^{I_0 R/V_T} \tag{36}$$

If equation (36) is compared with equation (34), it appears that the residual current is substantially twice as large as the quiescent current in the absence of an input voltage if it holds that $I_0 R > V_T$. The control behaviour of the arrangement is then substantially equal to that of the arrangement of FIG. 1. In the arrangement of FIG. 7 a capacitor $C_1$ is arranged between the base and the collector of transistor $T_1$, a capacitor $C_2$ is arranged between the base and the collector of transistor $T_2$ and a capacitor $C_3$ is arranged between the base and the collector of transistor $T_1$. These capacitors fulfill the same functions as the capacitors $C_1$, $C_2$ and $C_3$ in the embodiment of FIG. 4. Also in this embodiment the quiescent current of the non-driven output transistor is controlled to a constant residual value, thus preventing the occurrence of harmonic distortion.

It is evident that the arrangement of FIG. 7 may also comprise field-effect transistors instead of bipolar transistors.

The invention is not limited to the embodiments shown. The first and the second current measuring means may be constituted in any other way, provided that they generate a current which is a measure of the current flowing through the first and the second output transistor. The drive means may also be constituted in any other way, provided that they drive the first and the second output transistor in the push-pull mode. The embodiments of the amplifier arrangement according to the invention are either completely built up with bipolar transistors or they are completely built up with unipolar transistors. It is of course also possible to build up the amplifier arrangement with both unipolar and bipolar transistors.

What is claimed is:

1. An amplifier arrangement comprising
a first and a second output transistor each having a first main terminal, a second main terminal and a control terminal, whose main current paths are arranged in series between two power supply terminals and are further coupled to an output for connecting a load,
drive means for driving the first and the second transistor, said drive means having a first output which is coupled to the control terminal of the first transistor and a second output which is coupled to the control terminal of the second transistor,
quiescent current means for causing a quiescent current to flow through the first and the second output transistor, said quiescent current means having first and second current measuring means for generating a first and a second measuring current which are a measure of the current flowing through the first and the second output transistor, respectively, and having feedback means for controlling the quiescent current flowing through the first and the second output transistor by way of the first and the second measuring current,
characterized in that the feedback means comprise
a first differential amplifier having a third and a fourth transistor each having a control terminal, a first main terminal and a second main terminal, the second main terminals being coupled to a common point which is coupled to a first current source, the control terminal of the third transistor being coupled to a first point for conveying a voltage which is proportional to the first measuring current and the control terminal of the fourth transistor being coupled to a second point for conveying a voltage which is proportional to the second measuring current,
a reference circuit comprising a second current source and a fifth transistor having a first main terminal, a second main terminal and a control terminal which is coupled to the first main terminal, and
a second differential amplifier having a sixth and a seventh transistor each having at least one first main terminal, at least one second main terminal and a control terminal, the control terminal of the sixth transistor being coupled to the second main terminal of the fifth transistor, the control terminal of the seventh transistor being coupled to the common point of the first differential amplifier, and two of the first main terminals of the sixth and the seventh transistor being coupled to the first and the second output of the drive means.

2. An amplifier arrangement as claimed in claim 1, characterized in that
the first and the second output transistor are of the same conductivity type,
the sixth and the seventh transistor each have two first main terminals, and in that
the one first main terminal of the sixth transistor is coupled to the first output of the drive means and the other first main terminal of the sixth transistor is coupled to the second output of the drive means.

3. An amplifier arrangement as claimed in claim 1, characterized in that the first current measuring means include an eighth transistor having a first main terminal, a second main terminal and a control terminal, the control terminal and the second main terminal being coupled to the control terminal and the second main terminal, respectively, of the first output transistor and in that the second current measuring means include a ninth transistor having a first main terminal, a second main terminal and a control terminal, the control terminal and the second main terminal being coupled to the control terminal and the second main terminal, respectively, of the second output transistor.

4. An amplifier arrangement as claimed in claim 3, characterized in that the second main terminal of the eighth transistor is coupled to the second main terminal of the first output transistor by means of a first resistor and in that the second main terminal of the ninth transistor is coupled to the second main terminal of the second output transistor by means of a second resistor.

5. An amplifier arrangement as claimed in claim 3, characterized in that
the first main terminal of the eighth transistor is coupled to a first power supply terminal by means of a tenth transistor having a first main terminal, a second main terminal and a control terminal, the first main terminal of the tenth transistor being coupled to its control terminal and the second main terminal constituting the first point for conveying a voltage which is proportional to the first measuring current, the first main terminal of the ninth transistor is coupled to the first power supply terminal by means of an eleventh transistor having a first main terminal, a second main terminal and a control terminal, the first main terminal of the eleventh transistor being coupled to its control terminal and the second main terminal constituting the second point for conveying a voltage which is proportional to the second measuring current, and in that the first main terminal of the fifth transistor is coupled to the first power supply terminal by means of a twelfth transistor having a first main terminal and a second main terminal and a control terminal, the first main terminal being coupled to its control terminal.

6. An amplifier arrangement as claimed in claim 1, characterized in that the drive means include a third differential amplifier having a thirteenth and a fourteenth transistor each having a first main terminal, a second main terminal and a control terminal, the control terminal and the first main terminal of the thirteenth transistor being coupled to the first input and the first output, respectively, of the drive means and the control terminal and the first main terminal of the fourteenth transistor being coupled to the second input and the second output, respectively, of the drive means.

7. An amplifier arrangement as claimed in claim 6, characterized in that a first capacitor is arranged between the first input and the first output of the drive means.

8. An amplifier arrangement as claimed in claim 6, characterized in that the first input of the drive means is coupled to an input of a fifteenth transistor arranged as a voltage follower, an output of which is coupled to the second output of the drive means by means of a second capacitor.

9. An amplifier arrangement as claimed in claim 2, characterized in that the first output of the drive means is coupled to a non-inverting input of an amplifier, an inverting input of which is coupled to the output of the amplifier arrangement and an output of which is coupled to the control terminal of the first output transistor.

10. An amplifier arrangement as claimed in claim 9, characterized in that the amplifier is constituted by a fourth differential amplifier having a sixteenth and a seventeenth transistor each having a control terminal and a first and a second main terminal, the control terminal of the sixteenth transistor being coupled to the non-inverting input and the control terminal of the seventeenth transistor being coupled to the inverting input, the first main terminal of the seventeenth transistor being coupled to the output of the amplifier and to a current source.

11. An amplifier arrangement as claimed in claim 9, characterized in that the first output of the drive means is coupled to an input of a voltage-follower circuit, an output of which is coupled to the control terminal of the first output transistor by means of a third capacitor.

12. An amplifier arrangement as claimed in claim 11, characterized in that a first diode is arranged in parallel with the third capacitor and in that a second diode is arranged between the second main terminal and the control terminal of the sixteenth transistor.

13. An amplifier arrangement as claimed in claim 2, characterized in that the transistors are bipolar transistors.

14. An amplifier arrangement as claimed in claim 2, characterized in that the transistors are field-effect transistors.

15. An amplifier arrangement as claimed in claim 1, characterized in that the first and the second output transistor are of the opposite conductivity type, the sixth and the seventh transistor each have a first main terminal and in that the first main terminal of the sixth transistor is coupled to the first output of the drive means and the first main terminal of the seventh transistor is coupled to the second output of the drive means.

16. An amplifier arrangement as claimed in claim 15, characterized in that the first current measuring means include an eighth transistor having a first main terminal, a second main terminal and a control terminal, the control terminal being coupled to the control terminal of the first output transistor and the second main terminal being coupled to the second main terminal of the first output transistor by means of a first resistor, said second main terminal of the eighth transistor constituting the first point for conveying a voltage which is proportional to the first measuring current, the second current measuring means include a ninth transistor having a first main terminal, a second main terminal and a control terminal, the control terminal being coupled to the control terminal of the second output transistor and the second main terminal being coupled to the second main terminal of the second output transistor by means of a second resistor, the first main terminal of the ninth transistor is coupled to a first power supply terminal by means of a third resistor, said first main terminal of the ninth transistor constituting the second point for conveying a voltage which is proportional to the second measuring current, and in that the first main terminal of the fifth transistor is coupled to the first power supply terminal by means of a fourth resistor.

17. An amplifier arrangement as claimed in claim 1, characterized in that the drive means include a third differential amplifier with a tenth transistor having a first main terminal, a second main terminal and a control terminal and an eleventh transistor having two first main terminals, two second main terminals and a control terminal, the control terminal of the tenth transistor being coupled to the first input of the drive means and the control terminal and the two first main terminals of the eleventh transistor being coupled to the second input and the first and the second output, respectively, of the drive means.

18. An amplifier arrangement as claimed in claim 17, characterized in that a first capacitor is arranged between the first input and the first main terminal of the tenth transistor.

19. An amplifier arrangement as claimed in claim 16, characterized in that a second capacitor is arranged between the control terminal of the first output transistor and the output, and in that a third capacitor is arranged between the control terminal of the second output transistor and the output.

20. An amplifier arrangement as claimed in claim 5, characterized in that the transistors are bipolar transistors.

* * * * *